Sept. 21, 1965 R. W. AHRONS 3,207,921

SUPERCONDUCTOR CIRCUITS

Filed Sept. 26, 1961

INVENTOR.
RICHARD W. AHRONS

BY Carl V. Olson

ATTORNEY

United States Patent Office
3,207,921
Patented Sept. 21, 1965

3,207,921
SUPERCONDUCTOR CIRCUITS

Richard W. Ahrons, Somerville, N.J., assignor to Radio Corporation of America, a corporation of Delaware
Filed Sept. 26, 1961, Ser. No. 140,836
3 Claims. (Cl. 307—88.5)

This invention relates to superconductor circuits, and particularly to superconductor switching circuits.

Superconducting circuits are often arranged to utilize a principle of operation wherein two superconducting current paths are provided between an input terminal and respective ones of two output terminals. Each of the superconducting paths includes a gate conductor portion made of a material which can be more readily changed from the superconducting state to the resistive state than the remainder of the conductive path. The gate conductor portion of each path is crossed by a control conductor. Current in a control conductor can drive the gate conductor from a superconducting state to a resistive state. The device formed at the intersection of the control conductor and the gate conductor portion of the path is called a crossed film cryotron. In prior art arrangements for switching an input current through one or the other of two superconductive current paths, two control conductors are required. When one control conductor is energized, current flows from the input terminal through one path to one of the output terminals. When the other control conductor is energized, current flows from the input terminal through the other path to the other output terminal.

The use in the prior art of two control conductors in each switching stage as described above is illustrated in FIGURE 6 of an article entitled, "Superconducting Devices and Circuits," by Donald R. Young appearing at pages 84–87 of the October 16, 1960, issue of Electronics magazine. The article also provides background information on superconducting devices and circuits of the type with which the present invention is concerned.

It is a general object of the present invention to provide superconducting switching circuits which require fewer control conductors in the performance of switching functions than have been required in prior art circuits.

It is another object to provide a superconducting switching circuit wherein the control of one superconductive current path is provided by current in another parallel superconducting current path, rather than being provided by a control current in a separate control conductor.

It is a further object to provide a superconductor multistage switching tree circuit including fewer control conductors than heretofore have been necessary.

According to an example of the present invention, there are provided first and second superconductive current paths from an input terminal to two respective output terminals. The two paths cross each other, or pass near each other, and at the crossover, the second path includes a gate conductor which is driven from a superconducting to a resistive state by current in the first path. Therefore, current from the input terminal initially divides equally between the two paths until the gate conductor in the second path is driven resistive, after which all the current flows in the first path. Additionally, there is provided a single control conductor and an associated gate conductor in the first path which normally conducts. The control conductor permits a switching of the current from the normally conductive first path to the second path.

These and other objects and aspects of the invention will be apparent from the following more detailed description of a preferred embodiment of the invention illustrated in the accompanying drawings, wherein.

Figure 1:
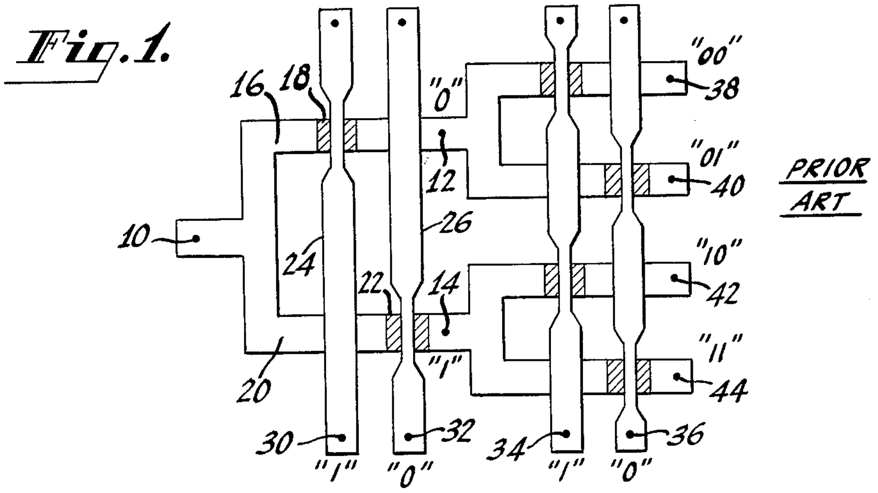
FIGURE 1 is a representation of a multistage superconductor switching tree circuit constructed according to the prior art and requiring two control conductors in each stage.

FIGURE 1 shows a prior art superconductor multistage switching tree circuit wherein the first stage includes an input terminal 10 and output terminals 12 and 14. A superconductive current path 16 between terminals 10 and 12 includes a gate conductor 18 inserted therein. A second superconductive current path 20 between terminals 10 and 14 includes a gate conductor 22 therein. A first control conductor 24 is positioned with relation to the gate conductor 18 for driving the gate conductor from a superconducting to a resistive state. Similarly, a second control conductor 26 is positioned with relation to the gate conductor 22 for driving the gate conductor 22 from a superconducting to a resistive state. The superconductive current paths and the control conductors each may be constructed of a thin film of lead having a critical temperature of 7.22° Kelvin. The gate conductors 18 and 22 each may be constructed of a thin film of tin having a critical temperature of 3.72° Kelvin. Insulating and ground plane layers are omitted from the drawing for reasons of clarity of illustration.

In the operation of the first state of the prior art switching circuit of FIGURE 1, a current is applied to the input terminal 10. In the absence of a control signal on the control conductors 24 and 26, the current will divide equally in the two paths 16 and 20 and will appear at the output terminals 12 and 14. If a current is passed through the control conductor 24, the resulting magnetic flux in the vicinity of the gate conductor 18 causes the gate conductor to switch from a superconducting state to a resistive state. In this event, all the current from the input terminal 10 is directed through the superconducting path 20 to the output terminal 14. On the other hand, if a current is applied to the control conductor 26, the gate conductor 22 is switched from a superconducting state to a resistive state and all the current from input terminal 10 is directed through the superconducting path 16 to the output terminal 12. It is thus seen that, according to the prior art, two control conductors 24 and 26 are required for determining whether the current applied to input terminal 10 will be switched to one or the other of output terminals 12 and 14.

FIGURE 1 also shows a succeeding stage of a switching tree circuit which operates in the same manner as has been described in connection with the first stage. A control current applied to one or another of control conductor terminals 30 and 32, and a control current applied to one or the other of the control conductor terminals 34 and 36, directs the flow of current from the input terminal 10 to a corresponding one only of the four output terminals 38, 40, 42 and 44.

Figure 2:
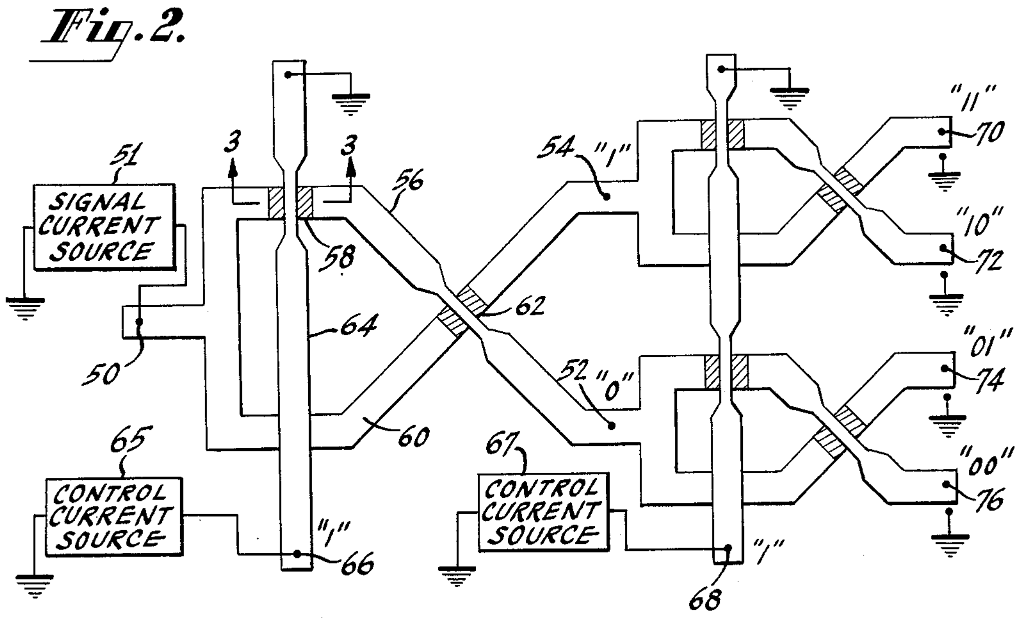
FIGURE 2 is a representation of a superconductor multistage switching tree circuit according to the invention which performs the function of the circuit of FIGURE 1 while requiring only half as many control conductors as are required in the prior art arrangement.

FIGURE 2 shows a superconductor multistage switching tree circuit, according to the invention, for performing the same function performed by the prior art circuit of FIGURE 1. The first stage of the switching tree circuit of FIGURE 2 includes an input terminal 50 receptive to a current from a signal current source 51, a first output terminal 52, and a second output terminal 54. A first superconductive current path 56 is connected from the input terminal 50 to the output terminal 52. This first superconductive path includes an interposed gate conductor 58. A second superconductive current path 60 is connected from the input terminal 50 to the output terminal 54. This second superconductive path includes an interposed gate conductor 62. The superconductive current path 56 crosses the superconductive current path 60 at the gate conductor 62 in the path 60. The superconductive current path 56 can thus act as a control conductor for the path 60.

A control conductor 64 is positioned so that a current therethrough from a control current source 65 can drive the gate conductor 58 is a first superconductive current path 56 from a superconducting state to a resistive state.

Figure 3:
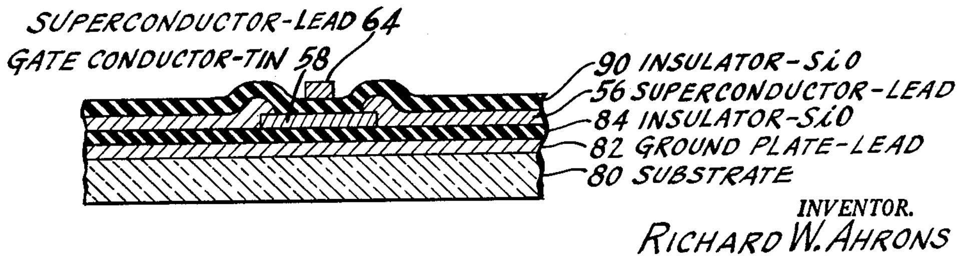
FIGURE 3 is a sectional view taken along the lines 3—3 of FIGURE 2.

The construction of the superconductor switching circuit of FIGURE 2 may be accomplished by known techniques. FIGURE 3 illustrates, in cross section, the typical relationship of the various superconducting and insulating layers at the cryotrons in the circuit of FIGURE 2. It is seen from FIGURE 3 that the structure includes a substrate 80 which may be glass, a thin ground plane 82 which may be lead, an insulating layer 84 which may be silicon monoxide, a superconductive current path 56 which may be lead, a gate conductor 58 in the superconductive current path which may be tin, an insulating layer 90 which may be silicon monoxide and, finally, a control current path 64 which may be lead. The gate conductor 58 inserted in the superconductive current path 56 is a material which is more easily switched from a superconducting state to a resistive state than the remainder of the conductive paths. Tin is useful in that it has a critical temperature of 3.72° Kelvin, whereas lead has a critical temperature of 7.22° Kelvin. A smaller control current, and accompanying magnetic flux, is required (at a given temperature below 3.72° Kelvin) for driving tin to the resistive state than is required for driving lead to the resistive state.

In the operation of the first stage of the switching tree circuit of FIGURE 2, a signal current applied to the input terminal 50 will tend to divide equally in the two superconductive current paths 56 and 60. However, the half of the signal current flowing in the superconductive current path 56 generates a magnetic flux which tends to drive the gate conductor 62 in the path 60 from a superconducting state to a resistive state, whereas the resistance of the path 56 remains zero. A slight increase in the resistance of the gate conductor 62 causes a corresponding increase in the current through the path 56. The interaction progresses at a rapid rate until the gate conductor 62 is fully resistive, with the result that all of the signal current from the input terminal 50 flows through the superconductive current path 56. It is thus seen that, in the absence of a control current applied to the control conductor 64, all of the signal current applied to input terminal 50 flows through path 56 to output terminal 52.

When a control current is applied through the control conductor 64, the control current is accompanied by a magnetic flux which drives the gate conductor 58 in the path 56 from a superconducting state to a resistive state. This causes all of the signal current supplied to the input terminal 50 to flow through the superconductive current path 60 to the output terminal 54. Therefore, if the application of a control current to the control terminal 66 of the control conductor 64 represents 1, and the absence of such a control current represents 0, then a signal current flows from the input terminal 50 to the output terminal 54 to produce a 1 output when a 1 is applied to the control terminal 66 and a signal current flows from the input terminal 50 to the output terminal 52 to produce a 0 output in the absence of a control current applied to the control electrode 66.

The second stage of the multistage tree switching circuit shown in FIGURE 2 operates in a fashion similar to that described in connection with the operation of the first stage. The operation of the entire circuit is such that the presence or absence of a 1 control current from source 65 at control terminal 66, and the presence or absence of a 1 control current from source 67 at the second stage control terminal 68, results in the flow of signal current from the input terminal 50 to only the corresponding one of the output terminals 70, 72, 74 and 76.

The switching tree circuit according to the invention as illustrated in FIGURE 2 requires half as many control conductors as is required by the prior art arrangement of FIGURE 1. A switching tree, such as may be utilized for addressing memory locations in a superconductor memory, includes a great many cascaded stages. It is therefore desirable to be able to reduce the number of control conductors required for each stage. It is additionally desirable to be able to control each stage of the switching tree circuit by the use of a current pulse representing 1 and the absence of a current pulse representing 0. By contrast, the prior art arrangement requires a control current representing 1 on one control conductor, and a current pulse representing 0 on another, separate control conductor.

What is claimed is:

1. The combination of
a first branching circuit including an input terminal, first and second superconductive paths from said input terminal to first and second output terminals, said paths being constructed and positioned so that a signal current in said first path can drive a portion of said second path from a superconducting to a resistive state,
a first control conductor for driving a portion of said first path from a superconducting to a resistive state,
second and third similar branching circuits each having an input terminal connected to a respective one of said first and second output terminals of said first branching circuit, and
a second control conductor for driving portions of the first paths of said second and third branching circuits from superconducting to resistive states.

2. A switching tree, comprising
a first branching circuit including an input terminal, first and second superconductive paths from said input terminal to first and second output terminals, a gate conductor in each of said first and second paths, said paths being positioned so that a signal current in said first path can drive said gate conductor in the second path from a superconducting to a resistive state,
a first control conductor for driving the gate conductor in said first path from a superconducting to a resistive state,
second and third similar branching circuits each having an input terminal connected to a respective one of said first and second output terminals of said first branching circuit, and
a second control conductor for driving the gate conductors in the first paths of said second and third branching circuits from superconducting to resistive states,
whereby selective energization of said first and second control conductors can result in directing a signal current from said input terminal to any one of four output terminals.

3. A switching tree, comprising
a first branching circuit including an input terminal, first and second superconductive paths from said input terminal to first and second output terminals, a gate conductor in each of said first and second paths, said paths being positioned so that a signal current in said first path can drive said gate conductor in the second path from a superconducting to a resistive state,
a first control conductor for driving the gate conductor in said first path from a superconducting to a resistive state,
a second similar branching circuit having its input terminal connected to said first output terminal of said first branching circuit, a third similar branching circuit having its input terminal connected to said second output terminal of said first branching circuit, and a second control conductor for driving the gate conductors in the first paths of said second and third branching circuits from superconducting to resistive states, whereby selective energization of said first and second control conductors can result in directing a signal current from said input terminal to any one of four output terminals.

References Cited by the Examiner

UNITED STATES PATENTS

| | | | |
|---|---|---|---|
| 2,962,681 | 11/60 | Lentz. | |
| 2,966,647 | 12/60 | Lentz. | |
| 2,989,714 | 6/61 | Park. | |
| 3,019,349 | 1/62 | Sanborn. | |
| 3,060,323 | 10/62 | Nyberg. | |
| 3,086,197 | 4/63 | Anderson | 307—88.5 X |

ARTHUR GAUSS, *Primary Examiner*.

GEORGE N. WESTBY, *Examiner*.